United States Patent [19]
Lee

[11] Patent Number: 5,872,018
[45] Date of Patent: Feb. 16, 1999

[54] TESTCHIP DESIGN FOR PROCESS ANALYSIS IN SUB-MICRON DRAM FABRICATION

[75] Inventor: Daniel Hao-Tien Lee, Taipei, Taiwan

[73] Assignee: Vanguard International Semiconductor Corporation, Hsin-Chu, Taiwan

[21] Appl. No.: 851,596

[22] Filed: May 5, 1997

[51] Int. Cl.⁶ .................................................. H01L 21/66
[52] U.S. Cl. ............................................ 438/18; 438/253
[58] Field of Search ............................ 438/17, 18, 253, 438/396, 620

[56] References Cited

U.S. PATENT DOCUMENTS

| | | | |
|---|---|---|---|
| 4,672,314 | 6/1987 | Kokkas | 438/18 |
| 5,279,975 | 1/1994 | Devereaux et al. | 438/18 |
| 5,329,228 | 7/1994 | Comeau | 324/765 |
| 5,468,541 | 11/1995 | Hsu | 428/210 |
| 5,506,804 | 4/1996 | Yanagisawa et al. | 365/189.11 |
| 5,627,083 | 5/1997 | Tounai | 438/18 |
| 5,691,223 | 11/1997 | Pittikoun et al. | 438/253 |

*Primary Examiner*—Chandra Chaudhari
*Attorney, Agent, or Firm*—George O. Saile; Stephen B. Ackerman

[57] ABSTRACT

Integrated circuit chips having large regions of different device density and topography are susceptible to local processing variations which give rise to systematic failures affecting some circuit regions and not others. Over simplified test structures cannot signal these failures during processing. Memory chips have large regions of storage cell arrays serviced by sizeable peripheral regions consisting of logic circuits. The device density and configuration in each of these regions on the chip are quite different. During processing steps these regions present differently to the process agents such as chemical etchants and plasmas producing in local variations of processing rates occur which result in systematic under processing in one region or over processing in another. Memory chips are particularly prone to such variations and also lend themselves well to the design of product specific test structures for flagging these aberrations. Several test structures are described which are formed from regions of the integrated circuit product itself. The structures are designed to monitor specific process steps where such local variations occur. The invention teaches the use of product specific test structures for process monitoring of sub-micron DRAM integrated circuits. The structures described are portions of the cell array outfitted with test probe pads and are capable of measuring opens and shorts in wordlines and bitlines. Another structure comprises a testable string of bitline contacts.

8 Claims, 11 Drawing Sheets

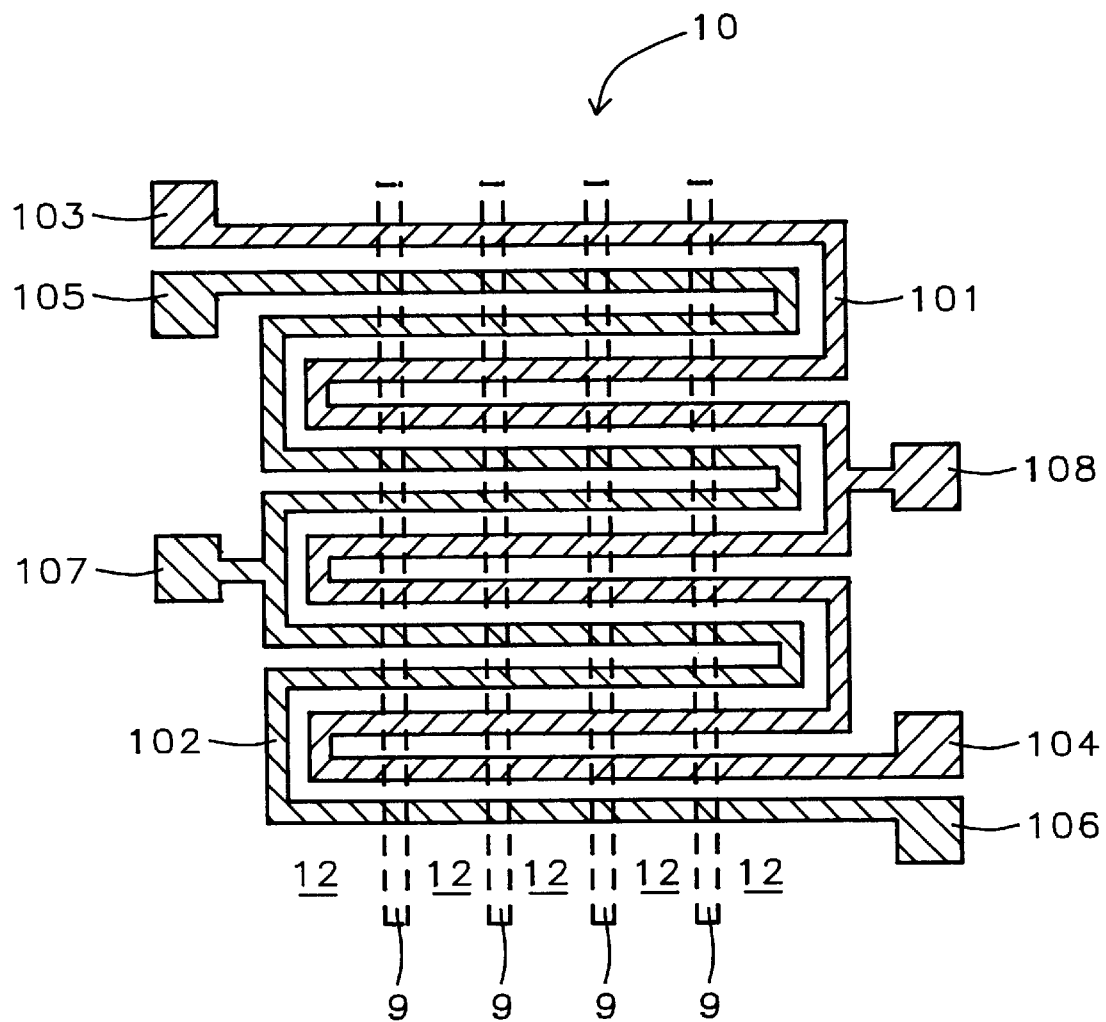
FIG. 1 – Prior Art

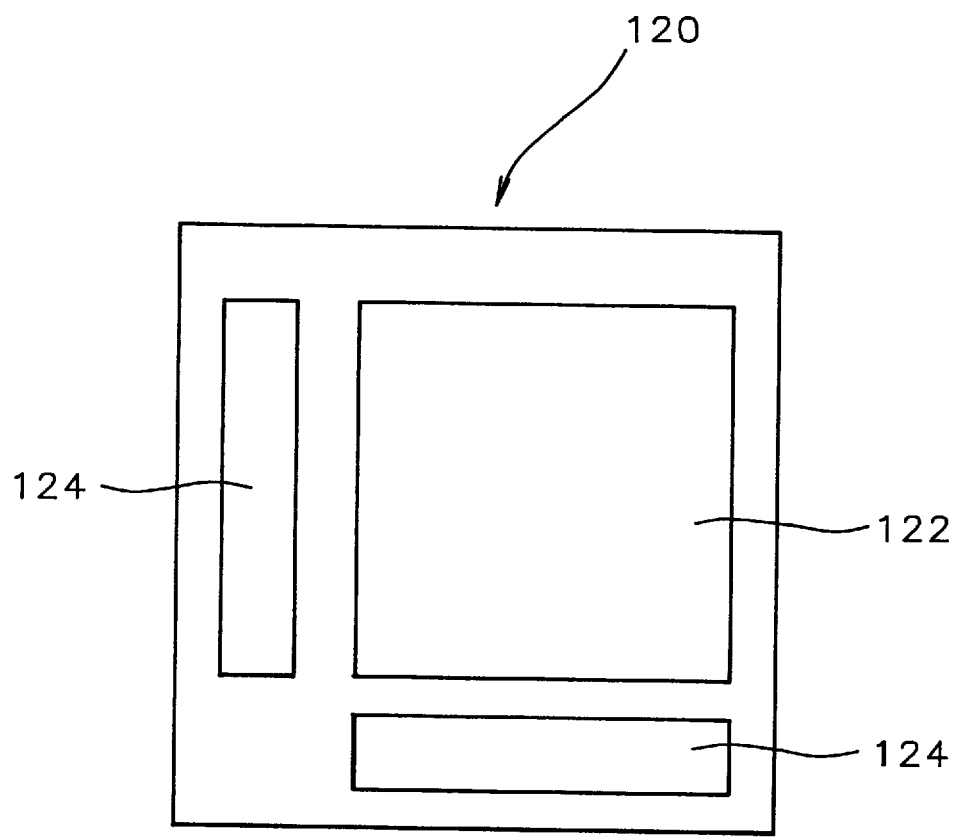
FIG. 2 - Prior Art

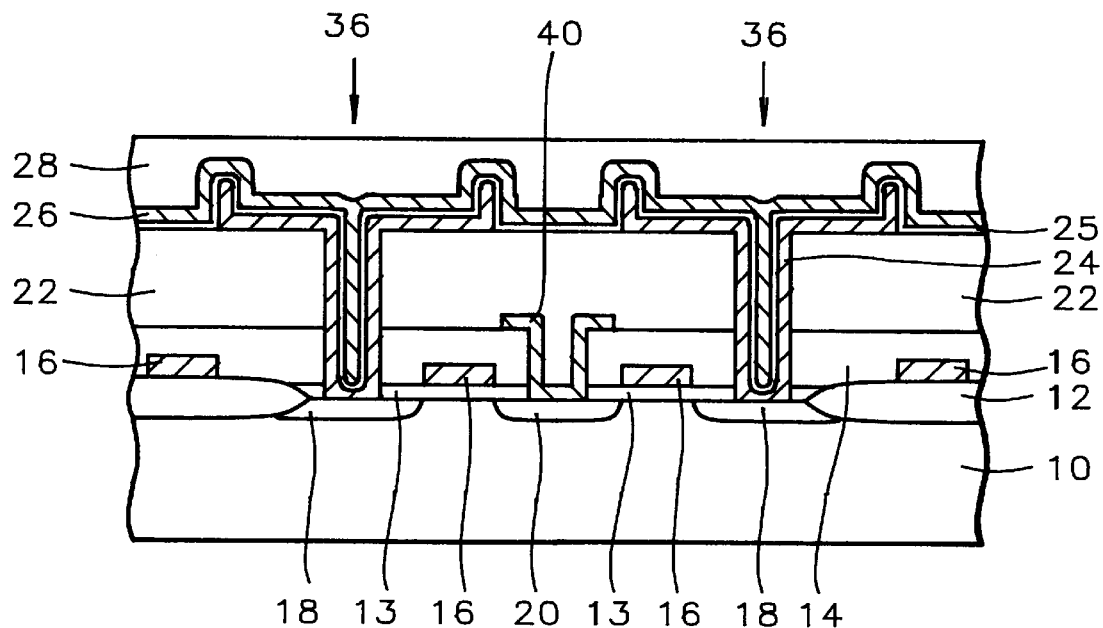
FIG. 3 – Prior Art
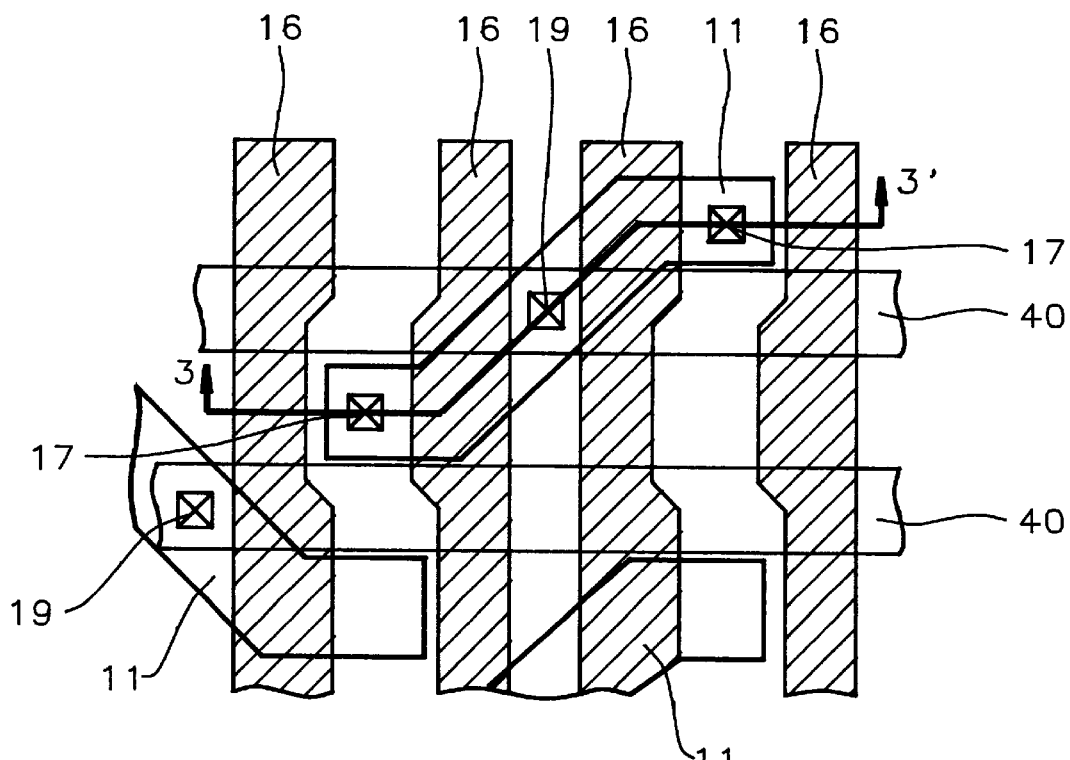
FIG. 4 – Prior Art

TESTCHIP DESIGN FOR PROCESS ANALYSIS IN SUB-MICRON DRAM FABRICATION

BACKGROUND OF THE INVENTION (1) Field of the Invention

This invention relates to monitoring and diagnostics of line processes used for the manufacture of semiconductor devices and more particularly to the design of product specific test chips.

(2) Description of prior art

Integrated circuits(ICs) are manufactured by first forming discrete semiconductor devices within the surface of silicon wafers. A multi-level metallurgical interconnection network is then formed over the devices contacting their active elements and wiring them together to create the desired circuits. The wiring layers are formed by first depositing an insulating layer over the discrete devices, patterning and etching contact openings into this layer, and then depositing conductive material into these openings. A conductive layer is then applied over the insulating layer which is then patterned and etched to form wiring interconnections between the device contacts thereby creating a first level of basic circuitry. These circuits are then further interconnected by utilizing additional wiring levels laid out over a additional insulating layers with via pass throughs.

Depending upon the complexity of the overall integrated circuit, one or two levels of patterned polysilicon conductors and two or more levels of metallurgy are required to form the necessary interconnections and to direct the wiring to pads which make the external connections for the completed chip. These patterns are formed by photolithographic masking techniques accompanied by reactive ion etching(RIE). The formation of such patterns invariably results in topographic features which effect the integrity of subsequently deposited layers, in particular when these layers are deposited by directional techniques such as sputtering or vacuum evaporation. Metal layers are typically deposited by such techniques.

Topographic features cause shadowing which results in poor edge coverage by the metal layer. When wiring patterns are subsequently etched in these layers, the regions of poor edge coverage are open or resistive, and likely to cause failure. Although various steps are taken to smooth out surface non-planarities, such as chemical mechanical polishing and thermally flowing of insulative glass layers, edge coverage problems still occur, As device geometries continue to shrink and deposited layers become thinner, process control must include testing integrity of these conductors.

In addition to the shadowing effects caused by topographic features, variations in device density over the surface of the wafer can cause processing variations. Differences in device density can cause local variations of processing rates which can cause some regions to be under processed and others to be over processed.

Whereas an integrated circuit chip may undergo a hundred or more discrete processing steps from starting wafer to finished chip, electrical testing of the chip itself is impossible until the chip is completed. Then only functionality tests may be done.

In order to monitor the step by step processing, parametric and defect test structures are used which are process step specific and can be tested between processing steps. During masterslice or front end of line(FEOL) processing, only parametric structures are used since actual devices are not yet formed. During the personalization or back end of line(BEOL) processing when the metal wiring levels are formed, testable structures may be conveniently formed and used to statistically evaluate find defects caused by particulate contamination. Processing steps such as photolithographic operations and plasma deposition and etching are particularly prone to defects caused by random particulate contamination which produces failure modes such as metal-to-metal shorts and opens. Interlevel shorts, and highly resistive or open vias and contacts.

Test structures for monitoring FEOL quantities such as implant resistivities, junction parameters and the like do not require large areas on the semiconductor wafer. They are frequently built into the saw kerf regions and are tested with probes during the FEOL processing.

Unlike parametric structures, the test structures required to examine the yield impact of random defect induced failure modes encountered in BEOL require larger semiconductor surface areas in order to give meaningful statistical information. Specifically, the structures which measure defect failure mechanisms must have critical areas comparable to those found on product chips. Thus, for example, a test structure which is designed to measure metal-to-metal shorts, must not only have an areas of adjacent metal lines comparable to such areas in the product but also there must be an adequate number of such structures present in order to provide statistically meaningful data.

In order to cope with these large area requirements a number of special die locations on each wafer may be allocated to these test structures. These are referred to as yield management test sites or simply as test chips. Clearly, their presence requires the sacrifice of valuable wafer area and they are either formed on separate test wafers inserted into jobs or they may occupy 3 to 6 chip locations on each product wafer. Statistical evaluations are made not at the wafer level but at the job level where an adequate sample size may be had.

The test structures themselves typically comprise mazes of serpentine metal or polysilicon lines, frequently with multiple taps, which correspond in width and spacing to lines on the product IC. These widths and spacings should generally reflect the dimensions found in the IC counterpart. The ends and taps of these lines are brought to probe pads which can be tested immediately after a metallization pattern is formed. The metal line mazes on a single metal level are tested for opens and shorts.

Test structures of various types for determining defect induced failure have been described. Comeau U.S. Pat. No. 5,329,228 describes a test chip which utilizes a transmission gate matrix which, when tested, provides information regarding a number of discrete failure types which can be attributed to certain processing steps. The structure can only be tested when the processing is complete. The process specific information such a test chip provides is only useful to point out serious process deviations to which much more timely alerts should be given. It is not cost effective to discover an process problem occurring at an early step with a test chip that must travel through the entire process.

Hsu U.S. Pat. No. 5,468,541 describes a test chip which looks at de-lamination of layers. This chip also engages the complete process and is then subjected to environmental stressing in order to discover processing problems. This test chip like that of Comeau are primary useful for evaluating chip and process design rather than for real-time process monitoring.

Integrated circuit chips contain various types of functional circuitry. The density if devices and wiring for each type can be quite different. This is particularly true for Dynamic-Random-Access-Memory(DRAM) where the density of wiring over the array portion of the chip is considerable different than that over the support circuitry. These variations affect some levels much more so than others. In addition the widths and spacings of the wiring over the array regions are different than those of the support circuits. Consequently the susceptibility of the array circuits to defect induced failures is different than that of the support circuits.

Shown in FIG. 1 is an example of a simple maze test structure formed on a wafer 10 from in a DRAM manufacturing process line. The maze is patterned in a first polysilicon layer which forms the gate electrodes of the product. The structure has two interlaced serpentine lines having a constant width and having probe pads at both ends of each line. For clarity, test line 101 is hatched differently than test line 102. Probe pads 103 and 104 are located at the ends of test line 101 and probe pads 105 an 106 are at the ends of test line 102. Optional pads 107 and 108 to taps are also shown. By themselves, the lines may be tested for opens and shorts. In this example, additional testing may be done to qualify a gate oxide which is formed beneath polysilicon lines 101 and 102 in the form of stripes 9 located between regions of field oxide 12. FIG. 2 is a cross section showing a polysilicon line 16 traversing one such gate oxide stripes 9.

By applying test probes between the polysilicon test lines 101 or 102 and the wafer 10, the integrity of the gate oxide 14 may also be determined immediately after the polysilicon 16 is patterned thereby providing timely data on, for example, gate oxide breakdown voltage.

Maze test structures of the type shown in FIG. 1, by virtue of their serpentine configuration, have a high critical area, and therefore a high sensitivity for random defects. By variation of the line widths and spacings, a size distribution of the random defects may be obtained. This information is valuable, not only for process development but for circuit design guidelines as well.

Although test structures such as the one shown in FIG. 1 and FIG. 2 can provide valuable data, their simplicity often belies more intricate and complex electrical consequences occurring in the product IC. These misrepresentations by the simple test structures become more pronounced as pattern and device dimensions shrink to sub-micron levels.

The parametric test structures, probed during FEOL, are essential in providing timely warning of tool malfunctions and other process irregularities, thereby permitting scrapping of out of spec wafers early on in the processing cycle. The serpentine, maze, and chain structures which can be tested after each metallization level, likewise provide timely information pointing out contaminated tools, etchant solutions and the like. The utilization of this type of process monitoring is essential to maintaining an efficient, high yielding, and cost effective manufacturing line.

There are, however, other process or design induced features which result in ultimate failure of integrated circuits. These may be classified as systematic or non-random failure mechanisms. Perhaps the simplest and easiest to comprehend systematic failure is the mask defect which will consistently cause a device failure and will not be flagged by the conventional test sites. Other types of systematic failures which manifest themselves particularly in present day ICs having varying degrees of circuit density and topology, cannot be properly detected by the simple conventional test sites.

Memory chips, for example, have large regions which consist of storage cell arrays. FIG. 2 is a plan view of the layout of a memory chip 120. The cell array 122 is serviced by sizeable peripheral logic circuits 124 known as address decoders. The device density and configuration in each of these regions on the chip are quite different. Line spacings and shapes as well as the surface topography are also different. During many types of processing steps these regions present differently to the process agents such as chemical etchants, plasmas, and the like. Consequently, local variations of processing rates occur which can result in systematic under processing in one region and over processing in another.

Yanagisawa et.al. U.S. Pat. No. 5,506,804 describes numerous testing procedures that may be done on a completed memory integrated circuit. This type of testing can reveal systematic defects in certain regions of the IC but in order to pinpoint process or design sources of these failures can require lengthy and costly physical unlayering of the failed chips. Process or design corrections could then be made. The time period between initial occurrence and repair of such defects could be enormous.

To find these failures and make process or design corrections in a timely fashion, test structures must be used which closely resemble a product IC in device density, pattern, and topology. For example, one may consider the process of etching a metal pattern using RIE. The etching time required to completely etch the pattern in a sparsely populated region of the IC chip may be considerably different from that in a region having a high density of metal lines. Such variations in feature density and topology are commonplace in the manufacture of DRAMs where the density and topology of features in the peripheral support circuitry is significantly different from that in the array area. Thus, while some regions of the chip may be properly etched, others areas may have residual pockets of metal which may produce shorts.

The causes of these pattern sensitive effects are varied. In instances where chemical processing is involved they are likely to be caused by a loading effect wherein reactant depletion occurs or topological features alter reactant accessibility. The effect of regions of different feature density and topology on processing characteristics is sometimes referred to as the global proximity effect. Simple parametric or maze type defect density structures described hereinbefore are not adequate for revealing such systematic problems.

The test structures required to address failure modes such as caused by the global proximity effect, must therefore resemble the product in great detail while at the same time be capable of measurement during the wafer process cycle. These test structures must be product specific and, at best, a single set of test structures could be associated with a class of closely related products.

Fortunately the ICs which are most affected by systematic processing problems are the ones which lend themselves best to the use of product specific test sites to address them. This invention deals with the use of product specific test chips in the manufacture of high density memories.

A portion of a current cell design for a stacked capacitor (STC) DRAM having diagonal active areas and a capacitor design similar to that of Dennison U.S. Pat. No. 5,292,677 is shown in cross section by FIG. 3 and in a top view by FIG. 4.

Referring first to FIG. 3, two storage capacitors 36, of a tubular design, are shown formed on a silicon wafer 10. The lower, storage plates 24 contact the source diffusions 18 of two adjacent metal oxide field effect transistors (MOSFET)s whose gates 16 comprise polysilicon wordlines. The bitline 40 connects to the common drain 20 of the two MOSFETs.

The polysilicon wordlines 16 located over field oxide regions 12 service other MOSFETS located in the array above and below the plane of the page. Inter-polysilicon-insulator (IPO) layers 14 and 22 support and insulate the large area portions of the capacitors 36 above the wordline/ bitline array. The capacitor dielectric, typically, a composite layer of $SiO_2/Si_3N_4/SiO_2$ (ONO) 25, is covered by the upper cell plate 26 which spans a plurality of cells.

An inter-level-dielectric (ILD) layer 28 insulates the upper cell plate 26 from a subsequently deposited metal layer, which becomes the first level of wiring for the DRAM circuits. Contacts, formed through openings in the ILD connect it to the circuit elements. Most of these contacts are directed to the peripheral circuitry of the DRAM.

Referring now to FIG. 4, a top view of the DRAM cell array is shown. The cross section of FIG. 4 through the line 3-3' is shown in FIG. 3. The active regions 11, are diagonally disposed to the perpendicular wordlines 16 and bitlines 40. The contact regions of the bitlines 17 and of the capacitor storage plates 19 to the active regions are shown.

This invention teaches the use of structures which closely resemble the cell array of a DRAM IC and can be tested during processing. The structures reflect the complexity and topology of the product cell array to signal systematic process aberrations as well as design defects which cause device failures.

SUMMARY OF THE INVENTION

It is an object of this invention to provide a method for designing product specific test structures which can be used for real-time process monitoring in the manufacture of sub-micron DRAM integrated circuits.

It is another object of this invention to provide a method for designing product specific test structures which can relate process and design tolerance information with regard to systematic failure mechanisms.

It is yet another object of this invention to provide designs for product specific test structures which can be tested in a timely fashion during processing, to detect and evaluate systematic failure modes, thereby permitting rapid turn around times for correction, either of process or of design.

It is yet another object of this invention to provide a method for designing test structures which can provide a database for developing product specific design ground rules.

These objects are accomplished by the use of an assembly of probe testable IC structures on a test chip, said structures comprising, for the most part, exact replicas of product functional regions. The testable structures may be formed from the product IC itself by providing the various functional regions with probable test pads or they may be designed separately on a test chip. Of primary importance is that the test structures have the same topography and component density as the product IC and that the layout of the test chip closely resembles that of the product with respect to circuit design, density and topography.

A testchip used to provide a database for design ground rules and process tolerance evaluation contains a groups several structures of the same type, each with design dimensions varying about a target value thereby creating a design window. Using the hereinbefore mentioned example of etch variation of polysilicon in different types of circuits, it may be found that by changing the minimum design ground rule for one circuit type will cancel or substantially reduce the occurrence of systematic failures cause by these etch variations.

The test chip structures represent all the fundamental circuit groups found on the product IC. The invention used a test chip for a DRAM IC as an example. The test chip then contains cell array structures, as well as structures of the various peripheral circuit modules such as address decoder circuits and sense amplifiers.

BRIEF DESCRIPTION OF THE DRAWINGS

FIG. 1 is a top view of a serpentine test structure.

FIG. 2 is a plan view of a memory integrated circuit chip.

FIG. 3 is a cross sectional view of a portion of a stacked capacitor DRAM cell array having a buried bitline.

FIG. 4 is a top view of a portion of a stacked capacitor DRAM cell array having a buried bitline.

DESCRIPTION OF THE PREFERRED EMBODIMENTS

Accordingly, in the embodiments of this invention, a p-type <100> oriented silicon substrate(wafer) is provided. The embodiments use, as an example, an integrated circuit process for the manufacture of a diagonal active stacked-capacitor with a highly packed storage node(DASH) cell DRAM. It is to be understood that the application of this invention is not confined to DRAM integrated circuits but could be applied to any semiconductor fabrication process.

The embodiments described are test structures having the features and topology of the cell array. It is to be understood that corresponding test structures from other regions of the IC may be simultaneously formed and tested. These test structures represent the various peripheral circuit groups, having different features and topology, found on the IC chip. It is also to be understood that the test structures of these embodiments are formed in concert with the formation of product integrated circuit chips, preferably on the same silicon wafers. Thus they undergo identical processing and handling.

Figure 5A:
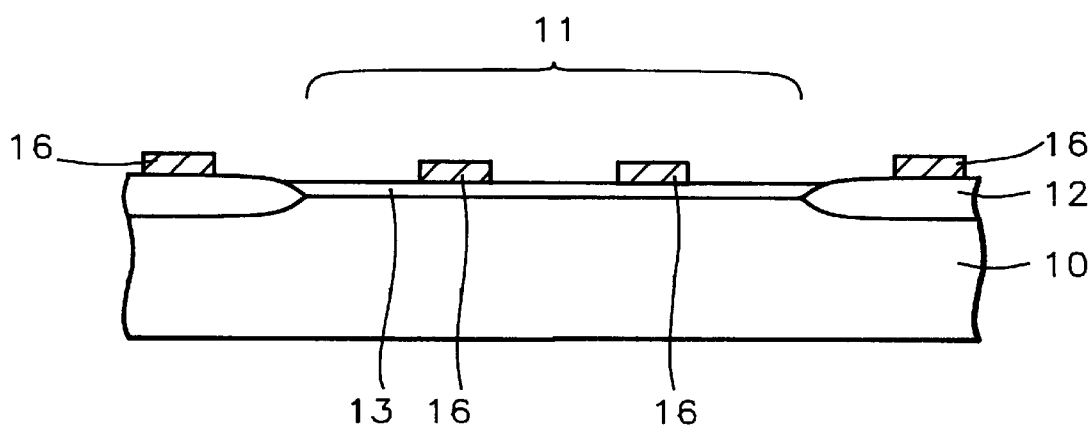
FIG. 5A is a cross sectional view of a portion of a first embodiment of this invention showing in-process testable wordlines after their formation.

Referring to the cross section in FIG. 5A the formation of a first embodiment of this invention is described. A p-doped <100> oriented monocrystalline silicon wafer 10 is provided. Field isolation regions 12 are formed by well known localized oxidation techniques defining a active region 11. A gate oxide 13 is formed over the active regions and polysilicon wordines 16 are patterned.

Figure 5B:
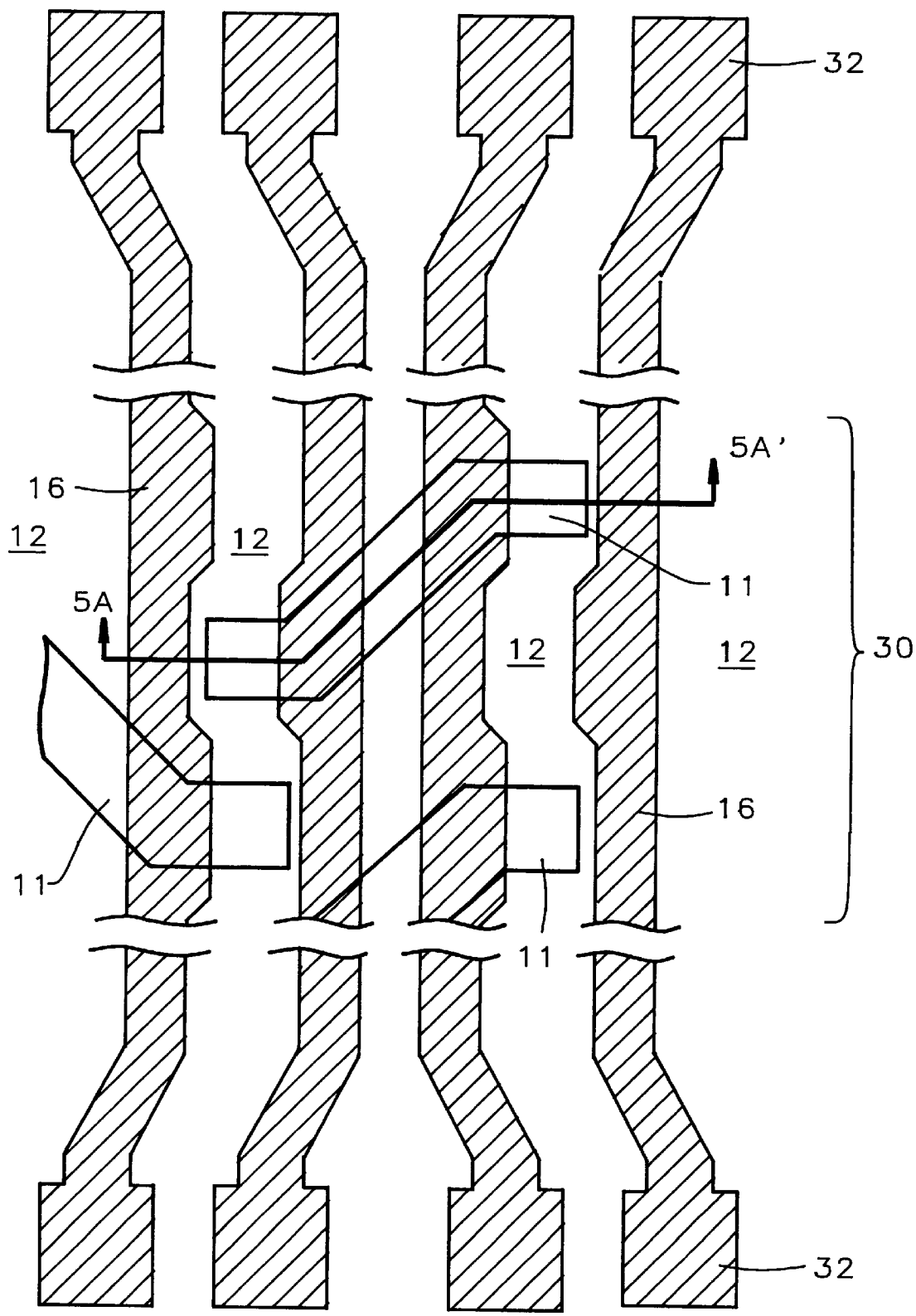
FIG. 5B is a top view of a portion of a first embodiment of this invention showing in-process testable wordlines after their formation.

Referring now to FIG. 5B there is shown a top view of a portion of the first embodiment of this invention. The cross section shown in FIG. 5A is indicated by the line 5A-5A'. This is the cell array portion of a test structure intended to be measured for systematic shorts between polysilicon word lines caused by, for example, insufficient etching during the polysilicon RIE. The embodiment is formed on the test chip using the identical process flow afforded to the corresponding product IC. The test chip may be formed on a test wafer or it may be formed on a designated chip site of a product IC wafer. The region 30 is identical to a region of the cell array of the product IC containing the silicon active areas 11 within the field oxide isolation 12.

To complete the design of the test structure, several wordlines 16 are terminated at probe contact pads 32 formed in the periphery of the test structure. Probe pads 32 are formed at both ends of each selected wordline. The high density of wordlines in the typical cell array structure will not permit the termination of every wordline on a probe pad. Therefore several selected groups of 2 to 4 mutually adjacent wordlines form the testable elements of the structure. At this point in the processing, the structure may be tested for shorts between adjacent wordlines and for wordline continuity by applying test probes to the contact pads 32.

Testing the cell array structure alone will indicate the presence or absence of shorts and opens. However, the causes of the failures will be indicated when similar tests are made on maze type structures of the type shown in FIG. 1. Shorts and opens tests on the maze structures indicate the presence of random defects. If the maze structures do not indicate shorts caused by random defects, and the test structure comprising the first embodiment has multiple shorts, a systematic process under etch of the polysilicon is indicated. Similarly, a high occurrence of word line discontinuities in the absence of excessive opens in the maze structures, indicates possible inadequate edge coverage by the polysilicon along contours such as over field oxide. Such occurrences, however, are more likely to occur with metal lines than with polysilicon which is deposited by a conformal process.

After testing is completed, further processing of the test chip forms a second embodiment of this invention. Referring to the cross section in FIG. 6A the formation of a second embodiment of this invention is described. The source and drain diffusions 18, 20 have been formed using the polysilicon gate electrodes for self-alignment. An insulative layer 14 is deposited over the gate electrode structure and this layer is planarized using chemical mechanical polishing or another planarization method. Bit line contacts 19 to the diffusion 20 are formed by etching openings into this layer and depositing the polysilicon bitline 40 into the contact openings. The bitlines 40 are then formed by etching a pattern in a deposited polysilicon layer. In other DRAM designs, bitlines are formed after the storage capacitor. These bitlines, typically of aluminum or an aluminum alloy, require a deeper contact and may employ the use of tungsten plugs to form the contact with the silicon diffusion 20.

Figure 6A:
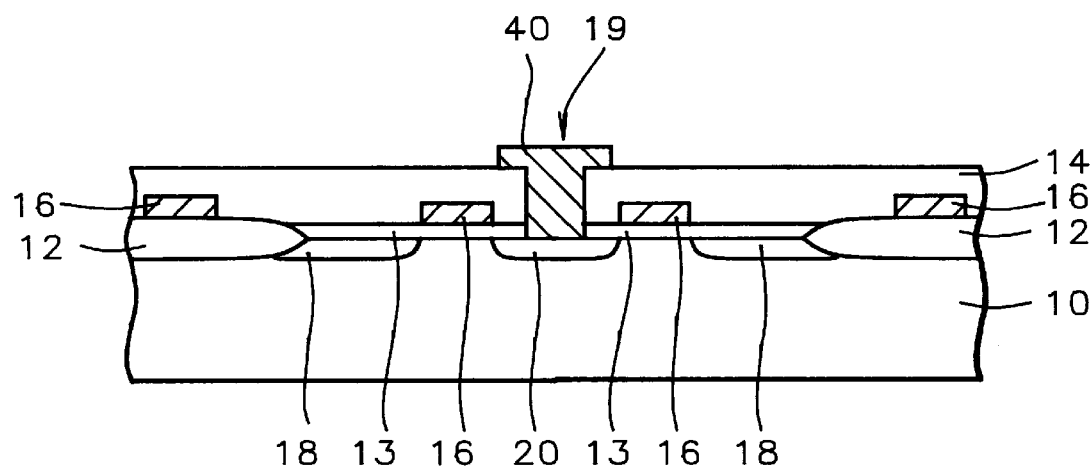
FIG. 6A is a cross sectional view of a portion of a second embodiment of this invention showing in-process testable bitlines after their formation.
Figure 6B:
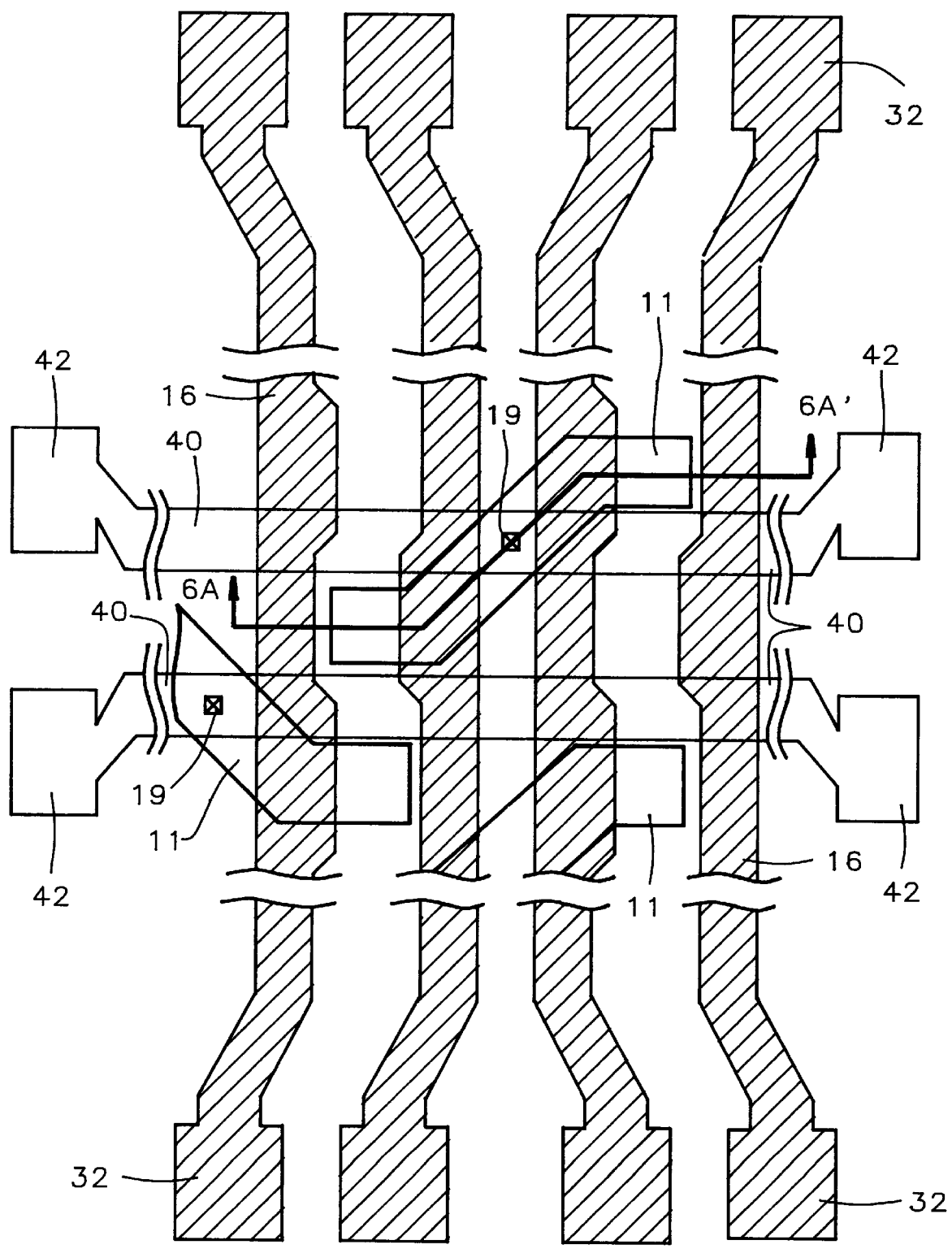
FIG. 6B is a top view of a portion of a second embodiment of this invention showing in-process testable bitlines after their formation.

Referring now to FIG. 6B there is shown a top view of a portion of a second embodiment of this invention after the bitlines 20 have been formed. The cross section shown in FIG. 6A is indicated by the line 6A-6A'. The bit lines connect to the diffusion 20 through contact 19. This is the cell array portion of a test structure intended to be measured for systematic shorts between polysilicon bit lines caused by, for example, insufficient etching during the polysilicon RIE. The embodiment is formed on the test chip using the identical process flow afforded to the corresponding product IC. The bitlines 20 run perpendicular to the wordlines 16.

To complete the design of the second embodiment a plurality of bitlines 40 are terminated at probe contact pads 42 formed in the periphery of the test structure. The high density of bitlines in the typical cell array structure will not permit the termination of every bitline on a probe pad. Therefore several selected groups of 2 to 4 adjacent bitlines form the testable elements of the structure. At this point in the processing, the structure may be tested for shorts between adjacent bitlines by applying test probes to the contact pads 42.

As with the test structure of the first embodiment, testing the bit lines in the cell array structure of the second embodiment alone will indicate the presence or absence of shorts and opens. However, the causes of the failures will be indicated when similar tests are made on maze type structures of the type shown in FIG. 1. Shorts and opens tests on the maze structures indicate the presence of random defects. If the maze structures do not indicate shorts caused by random defects, and the test structure comprising the second embodiment has multiple shorts, a systematic process under etch of the polysilicon is indicated.

After testing of the second embodiment is completed, further processing of the test chip forms a third embodiment of this invention. Referring to the cross section in FIG. 7A the formation of a third embodiment of this invention is described. An insulative layer 22 is deposited over the bitline pattern 40. Storage capacitors 36 are formed by a sequence of processing steps well known by those familiar with the art. The bottom storage plate 24 of each capacitor 36 contacts the silicon active area 18 of the MOSFETs. The top plates 26 of the storage capacitors 36 are connected together. An insulative layer 28 is deposited and conductive contacts 54 (FIG. 7B) and 56 (FIG. 7C) are formed to ends of the bitlines and wordlines respectively, in the periphery of the test structure. An additional contact (not shown) is made to the upper capacitor plate 26 so that functional testing of selected cells may be accomplished. A metal layer is next deposited and patterned to form connections 50 and 52 to the contacts.

Figures 7A, 7B, 7C:
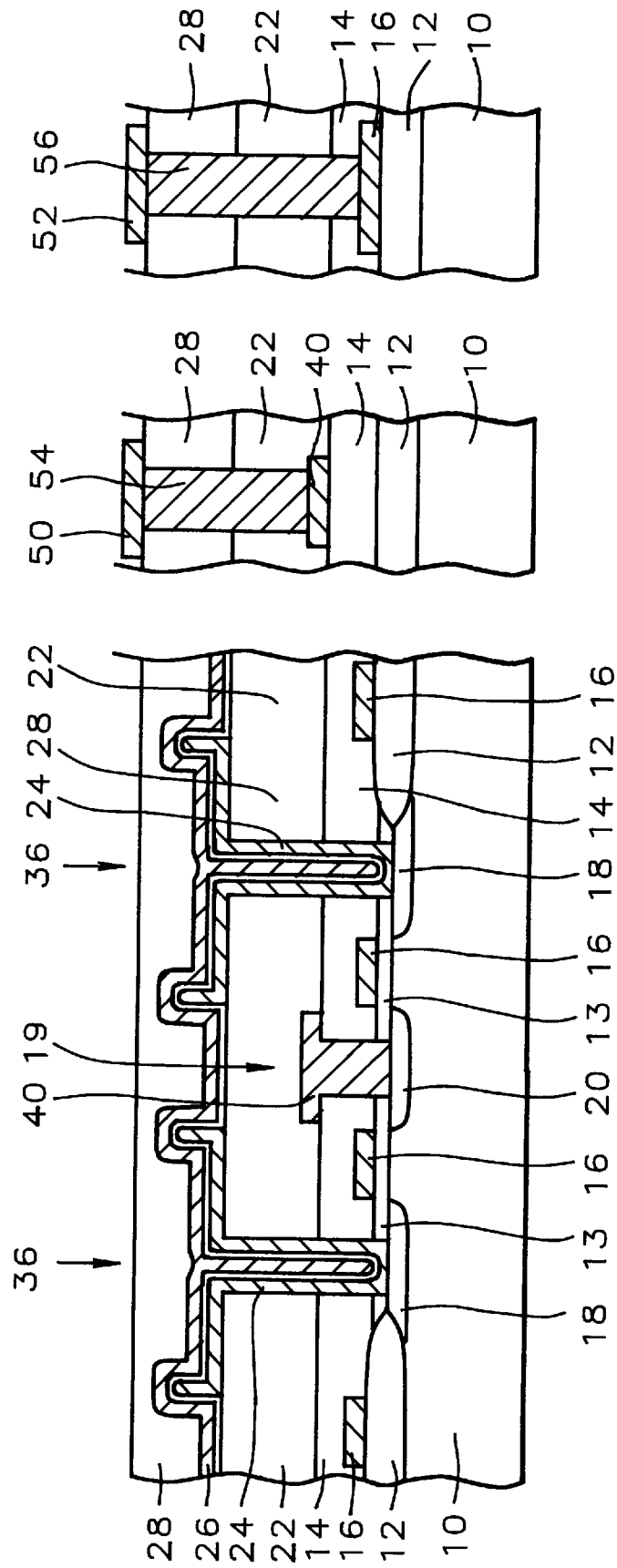
FIG. 7A is a cross sectional view of a portion of a third embodiment of this invention after a first metallization pattern is formed.
FIG. 7B is a cross sectional view of a portion of a third embodiment of this invention showing a bitline contact to a metal wiring pattern.
FIG. 7C is a cross sectional view of a portion of a third embodiment of this invention showing a wordline contact to a metal wiring pattern.
Figure 7D:
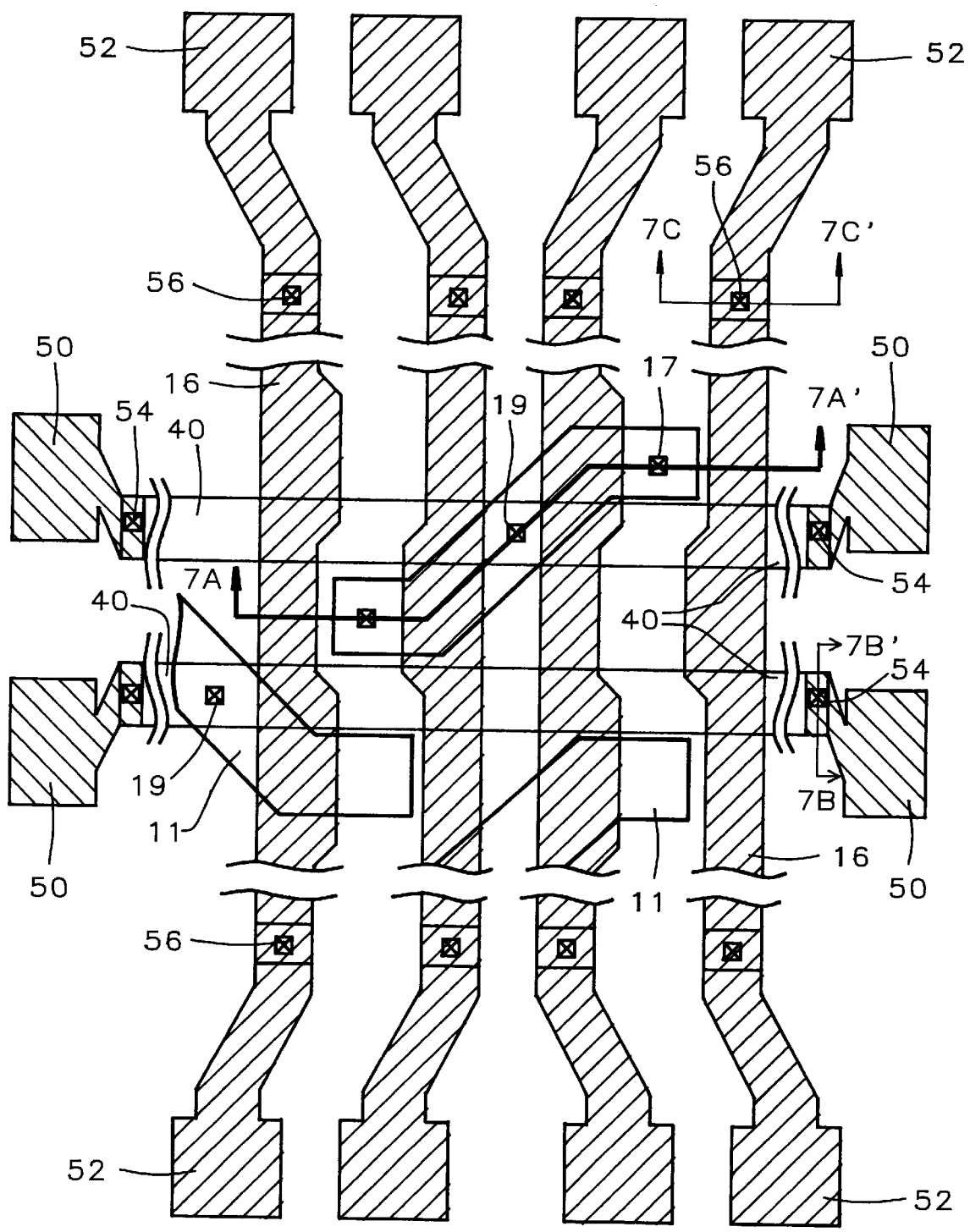
FIG. 7D is a top view of a portion of a third embodiment of this invention showing a completed DRAM cell array probe testable after first metal wiring.

Referring now to FIG. 7D there is shown a top view of the third embodiment. The cross section of FIG. 7A is denoted by the line 7A-7A'. The contact cross sections of FIG. 7B and 7C are likewise denoted by the lines 7B-7B' and 7C-7C' respectively. The metal connections to the contacts 54 and 56 are terminated by probe pads 50 and 52 respectively. As in the first and second embodiments, the probe pad terminated bitlines and wordlines are selected in groups of 2 to 4 adjacent units. Additional probe pads (not shown) are provided for other connections such as to the capacitor top plate 26 and the substrate 10.

The test chip may now be tested again for opens and shorts as well as for functionality of the cell array. Testing at this stage allows scrapping to take place before chip completion, thereby saving unnecessary processing costs of defective wafers.

In a fourth embodiment of this invention a test structure for the evaluation of bitline contact integrity is described.

The bitline contacts used in high density sub-micron DRAM cell arrays are numerous, small, and have high aspect ratios. DRAM designs which do not use polysilicon bitlines require more complex contact formation such as evaporated metals and the use of tungsten plugs accompanied by a barrier metallurgy such as Ti/TiN. These contacts typically involve the use of directional deposition processes which are non-conformal. Bitline contacts are therefore subjected to numerous occasions wherein minor process aberrations including localized process variations make them highly susceptible to being resistive or open.

Bitline contacts, such as those used in the design of the present embodiment, are formed early on in the process sequence. For this reasons it is highly desirable to have a test structure which can reliably signal contact irregularities in a timely fashion, thereby permitting scrapping and avoiding costly wasted processing.

The embodiments heretofore described have not required design changes within the cell array. The only mask changes required were the incorporation of probe pads at the ends of the wordline and bitline stripes. These embodiments provided for testing of line continuity as well as inter line shorts. In a fourth embodiment, the ability to test the integrity of bitline contacts is provided at the expense of losing half of the available cells in the test chip. This does not present any problem with regards to testing, however, since space available for probe contacts in the periphery of the test structure allows only a limited number of elements to be tested. However, in order to form contact strings it is necessary to include minor disruptions of topology in the cell array.

The fourth embodiment is a contact string formed on a test chip using the layout of the cell array of the corresponding product DRAM IC with a minimal variation. As with the preceding embodiments, the DRAM cell array layout lends itself well to the design and formation of structures for testing contact integrity. What is required for contact testing is a string of many contacts connected in series. This string is terminated with a probe pad at each end. Measurement of the resistance of the string signals the presence of open or resistive contacts. In order to form a serial string of bitline contacts the bitline must be interrupted at alternate contacts and the silicon diffusion to which the contacts connect must be used to make the string continuous.

The layout of the DASH cell DRAM includes four wordlines passing under the bitline between each pair of bitline contacts. In order to make the diffusion continuous between these contacts. These four wordlines must be interrupted under the bitline in order to permit dopant to access the silicon. In addition the field oxide must also have a channel corresponding to the path between the two bitline contacts.

Figure 8A:
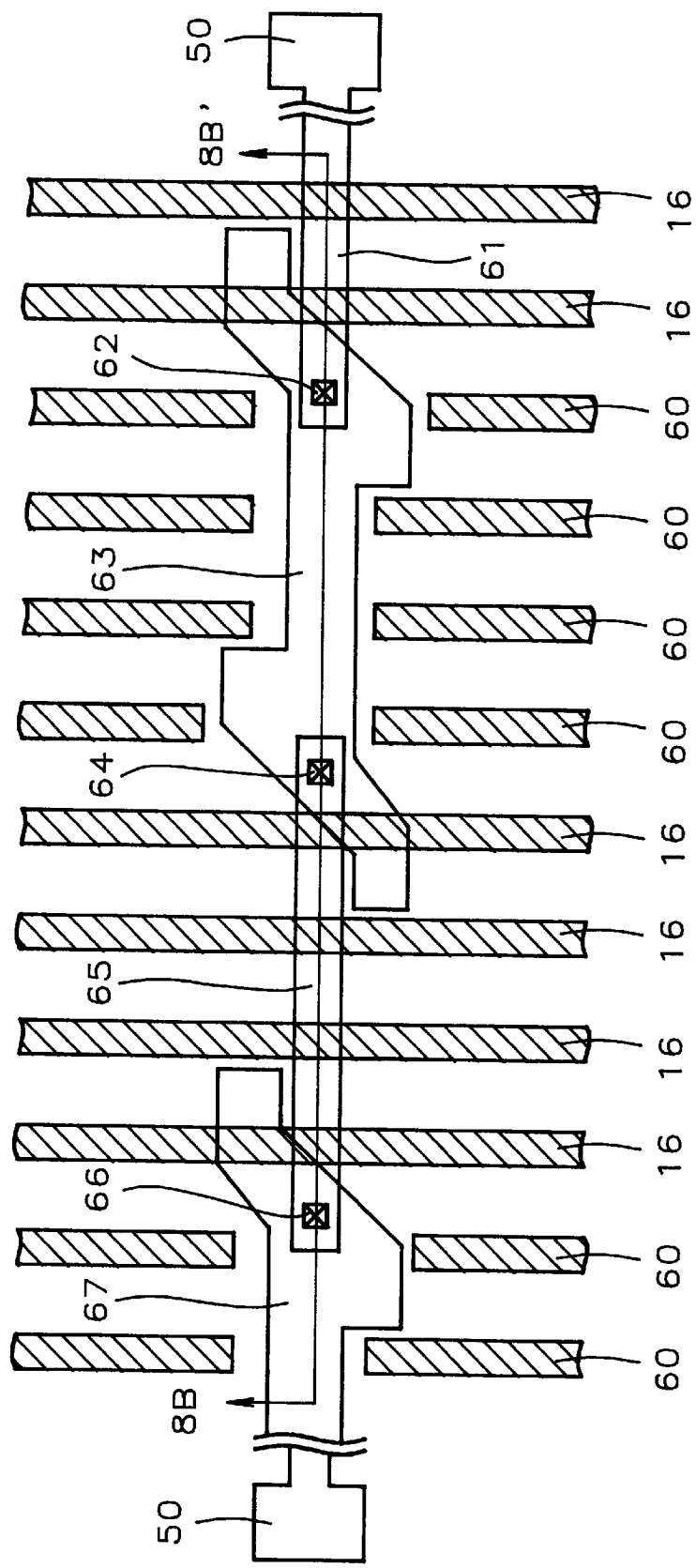
FIG. 8A is a top view of a portion of a fourth embodiment of this invention showing a contact string for testing bitline contact integrity.
Figure 8B:
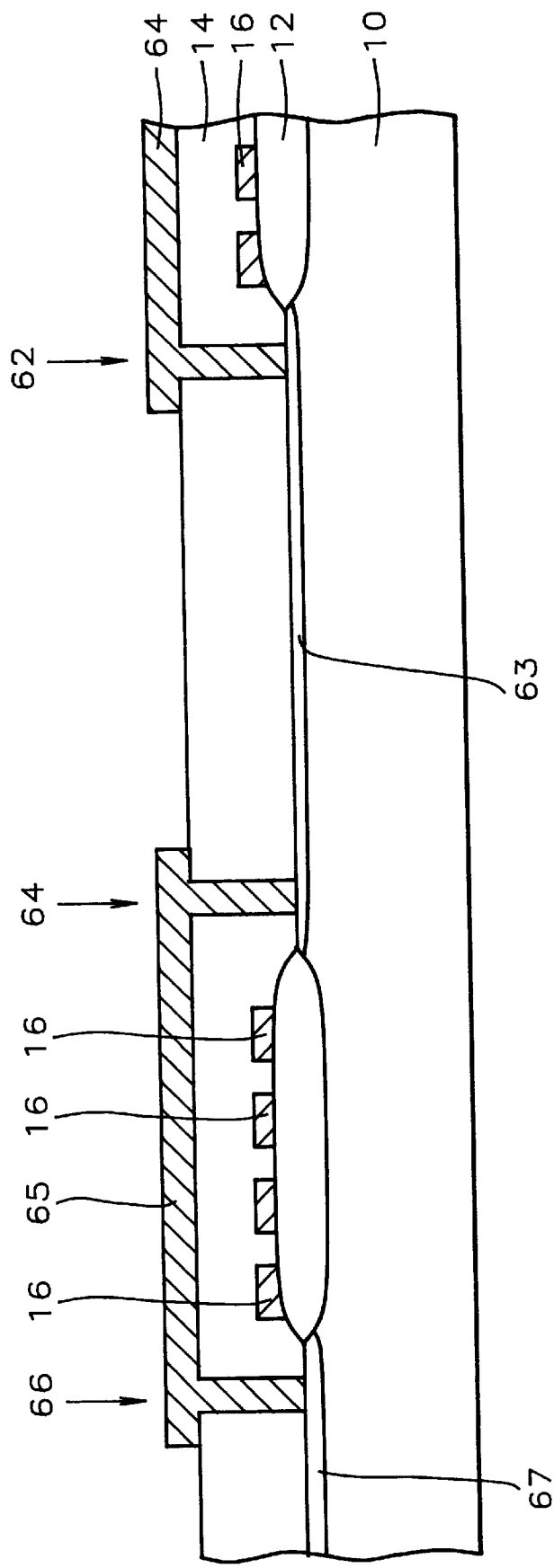
FIG. 8B is a cross sectional view of a portion of a fourth embodiment of this invention showing a contact string for testing bitline contact integrity.

FIG. 8A is a plan view of a portion of a bitline contact string on a DASH cell DRAM test chip formed in accordance with the fourth embodiment of this invention. The interrupted word lines 60 terminate near the edge of the active area diffusions 63 and 67 wordlines 16 pass uninterrupted under the bitline segments 63 and 65. As in the other embodiments the test lines are terminated by probe pads 50 over field oxide. The series path followed by the contact string is better shown in FIG. 8B which is a cross section of the region in FIG. 8A denoted by 8A-8A'. Test current travels from one probe pad to bitline segment 61, through bitline contact 62, to diffusion 63, thence through contact 64, through bitline segment 65, through contact 66 to diffusion 67 and so on through the string and to the other probe pad.

Electrical testing can be accomplished after the bitline is formed. Open or resistive contacts can be detected by measuring the resistance of the contact string between the two probe pads and comparing its value to an established target resistance. This will vary depending upon the size and design of the contact string.

While this invention has been particularly shown and described with reference to the preferred embodiments thereof, it will be understood by those skilled in the art that various changes in form and details may be made without departing from the spirit and scope of the invention.

The well known DRAM configuration shown in FIG. 1 acts as the reference for these and embodiments although the features of these embodiments are equally adaptable to other DRAM designs and configurations. The test lines or contact strings for smaller functional device regions, for example address decoder regions, may require the stripes to be formed in a serpentine, or otherwise in a sensible meandering pattern, in order to provide test structure size comparable to that in the corresponding IC. A key requirement for these test chip structures, however, is that they be designed to represent the pattern shape, topography and the density of corresponding features in the product IC. This can be accomplished in a most practical manner by using the IC design itself and making appropriate minor modifications to allow meaningful in process testing. The teaching of this principle is intended by the embodiments of this invention. In general, IC designs most vulnerable to systematic process irregularities also lend themselves well to simple modification for test chip structures.

Whereas the embodiments described use polysilicon conductive stripes in the formation of test chip structures for a DRAM, test chip structures can also be formed utilizing metal conductive stripes as occur at levels where metal wiring patterns are used. The principles of design and layout with regard to product IC taught by these embodiments should be equally followed in forming such test chips.

While the embodiments of this invention utilize a p-type silicon substrate, an n-type silicon substrate could also be used without departing from the concepts therein provided.

It should be further understood that the substrate conductivity type as referred to herein does not necessarily refer to the conductivity of wafer but could also be that of a diffused region wherein the devices are incorporated.

What is claimed is:

1. A method for electrical testing of a test structure during the manufacture of a DRAM integrated circuit comprising:
   (a) providing a test structure having
      (i) a region on a silicon substrate designated for a said test structure;
      (ii) field isolation formed in said region in a layout identical to field isolation in a portion of a cell array of said DRAM integrated circuit;
      (iii) semiconductive devices formed in said region in a layout identical to said cell array;
      (iv) wordlines patterned over said semiconductive devices in a layout identical to that of wordlines in said cell array; and
      (v) probe pads formed at the ends of a plurality of said wordlines and located over field oxide in the periphery of said test structure, said plurality of wordlines now becoming testable wordlines, by virtue of their having probe pads at each end, and said testable wordlines further being arranged in groups, each group containing at least three adjacent testable wordlines;
   (b) mounting said silicon substrate in a probe testing station;

(c) applying test probes to said probe pads;

(d) measuring resistance between adjacent testable wordlines; and (e) measuring resistance of each testable wordline.

2. The method of claim 1 wherein said test structure contains between about 50 and 5,000 partially processed memory cells.

3. The method of claim 1 wherein said semiconductive devices are self-aligned polysilicon gate MOSFETs.

4. The method of claim 1 further comprising:
(a) processing said test structure to form
(i) a first insulative layer over said wordlines;
(ii) bitlines patterned over said first insulative layer in a layout identical to identical to that of bitlines in said cell array passing, essentially parallel to each other, from one side of said region to the other and contacting said silicon active area through openings in said first insulative layer; and
(iii) probe pads formed at the ends of a plurality of said bitlines and located over said first insulative layer in the periphery of said structure, said plurality of said bitlines now becoming testable bitlines, by virtue of their having probe pads at each end, and said testable bitlines further being arranged in groups, each group containing at least three adjacent testable bitlines
(b) mounting said silicon substrate on a testing apparatus;
(c) applying test probes to said probe pads;
(d) measuring resistance between adjacent testable bitlines; and
(e) measuring resistance of each testable bitline.

5. The method of claim 4 further comprising:
(a) processing said test structure to form:
(i) a second insulative layer over said second conductive stripes;
(ii) storage capacitors formed over said second insulative layer in a layout identical to corresponding to storage capacitors in said cell array, and contacting active semiconductor regions;
(iii) a third insulative layer over said storage capacitors;
(iv) conductive contacts formed through openings passing through said third insulative layer, said second insulative layer, and first insulative layer, thereby contacting each end of a plurality testable wordlines;
(v) conductive contacts formed through openings passing through said third insulative layer and said second insulative layer, thereby contacting each end of a plurality of testable bitlines;
(vi) conductive contacts formed through openings passing through said third insulative layer, thereby contacting an upper plate of said storage capacitors;
(vii) a conductive contact to said silicon substrate;
(viii) conductive stripes patterned over said second insulative layer and contacting said conductive contacts; and
(ix) probe pads formed at the ends of said conductive stripes and located in the periphery of said structure thereby forming testable wordlines, testable bitlines, and testable cells
(b) mounting said silicon substrate on a testing apparatus;
(c) applying test probes to said probe pads;
(d) measuring resistance between adjacent testable wordlines; and
(e) measuring resistance of each testable wordline;
(f) measuring resistance between adjacent testable bitlines;
(g) measuring resistance of each testable bitline; and
(h) measuring functionality of testable cells.

6. The method of claim 5 wherein said conductive stripes are an aluminum or an aluminum alloy.

7. A method for electrical testing of bitline contacts during the manufacture of a DRAM integrated circuit comprising:
(a) providing a contact string having alternate sections of impurity doped silicon active area and conductive stripes connected by bitline contacts, said contact string further comprising:
(i) a region on a silicon substrate designated for said contact string;
(ii) a linear sequence of islands of impurity doped silicon active area, formed in the framework of said DRAM cell array in said region isolated from one another by field isolation;
(iii) an insulative layer over said silicon active areas;
(iv) openings in said insulative layer exposing portions of said islands of impurity doped silicon active area, said openings arranged to provide two openings over each island in said linear sequence;
(v) bitline contacts formed in said openings;
(vi) a series of conductive stripes, formed in the framework of said DRAM cell array over said insulative layer, said conductive stripes lying astride of said field isolation between said impurity doped silicon active area and forming a conductive path between successive islands through said contacts; and
(vii) probe pads formed at the ends of said contact string and located in the periphery of said region
(b) mounting said silicon substrate in a testing apparatus;
(c) applying test probes to said probe pads; and
(d) measuring the resistance of said contact string.

8. The method of claim 7 wherein said contact string contains between 50 and 5,000 bitline contacts.

* * * * *